US012604657B2

(12) United States Patent
Saidaminov et al.

(10) Patent No.: US 12,604,657 B2
(45) Date of Patent: Apr. 14, 2026

(54) HIGH-THROUGHPUT EXPLORATION OF TRIPLE-CATION PEROVSKITES VIA TERNARY COMPOSITIONALLY-GRADED FILMS

(71) Applicant: Solaires Entreprises Inc., Victoria (CA)

(72) Inventors: Makhsud Saidaminov, Victoria (CA); Shahram Moradi, Kanata (CA)

(73) Assignee: Solaires Enterprises, Inc., Victoria (CA)

(*) Notice: Subject to any disclaimer, the term of this patent is extended or adjusted under 35 U.S.C. 154(b) by 214 days.

(21) Appl. No.: 18/428,179

(22) Filed: Jan. 31, 2024

(65) Prior Publication Data

US 2025/0040425 A1 Jan. 30, 2025

(51) Int. Cl.
*H10K 85/50* (2023.01)
*C07F 19/00* (2006.01)
*H10K 30/40* (2023.01)

(52) U.S. Cl.
CPC .......... *H10K 85/50* (2023.02); *C07F 19/005* (2013.01); *H10K 30/40* (2023.02)

(58) Field of Classification Search
CPC ...................................................... H10K 85/50
See application file for complete search history.

(56) References Cited

PUBLICATIONS

Sun et al., "Accelerated Development of Perovskite-Inspired Materials via High-Throughput Synthesis and Machine-Learning Diagnosis," Joule 3, pp. 1437-1451, 2019. (Year: 2019).*

Ahmadi et al., "Machine learning for high-throughput experimental exploration of metal halide perovskites," Joule 5, pp. 2797-2822, 2021. (Year: 2021).*

Awais, M., Thrithamarassery Gangadharan, D., Tan, F. & Saidaminov, M. I. How to Make 20% Efficient Perovskite Solar Cells in Ambient Air and Encapsulate Them for 500 h of Operational Stability. Chem. Mater. (2022) doi: 10.1021/acs.chemmater.2c01422.

(Yoo, J. J. et al. Efficient perovskite solar cells via improved carrier management. Nat. 2021 5907847 590, 587-593, 2021.

(Continued)

*Primary Examiner* — Robert A Vetere

(74) *Attorney, Agent, or Firm* — Baumgartner Patent Law, LLC; Marc Baumgartner

(57) ABSTRACT

A high throughput method of synthesizing and characterizing a multiplicity of ternary compositions is provided, the method comprising: selecting three components; depositing a gradient of a first component along a first axis; depositing a gradient of a second component along a second axis which is normal to the first axis, such that the gradient is thickest at a first end and thinnest at a second end; and depositing a gradient of a third component along the second axis such that the gradient is thickest at the second end and thinnest at the first end to provide a compositional distribution of the multiplicity of ternary compositions; mapping the compositional distribution of each of the multiplicity of ternary compositions; and analyzing each of the multiplicity of ternary compositions, thereby synthesizing and characterizing the multiplicity of ternary compositions.

8 Claims, 16 Drawing Sheets
(15 of 16 Drawing Sheet(s) Filed in Color)

(56) References Cited

PUBLICATIONS

Sandström, A., Dam, H. F., Krebs, F. C. & Edman, L. Ambient fabrication of flexible and large-area organic light-emitting devices using slot-die coating. Nat. Commun. 3, 1002, 2012.
Jeon, N. J. et al. Compositional engineering of perovskite materials for high-performance solar cells. Nat. 2015 5177535 517, 476-480, 2015.
Saidaminov, M. I. et al. High-quality bulk hybrid perovskite single crystals within minutes by inverse temperature crystallization. Nat. Commun. 6, 7586 2015.

* cited by examiner

HIGH-THROUGHPUT EXPLORATION OF TRIPLE-CATION PEROVSKITES VIA TERNARY COMPOSITIONALLY-GRADED FILMS

CROSS REFERENCE TO RELATED APPLICATIONS

The present application claims benefit of Canadian Patent Application Serial No. 3189139, filed on Feb. 9, 2023, entitled HIGH-THROUGHPUT EXPLORATION OF TRIPLE-CATION PEROVSKITES VIA TERNARY COMPOSITIONALLY-GRADED FILMS, the contents of which are incorporated herein by reference in their entireties.

FIELD

A rapid method of synthesizing ternary compositions is provided. More specifically, a method of synthesizing and characterizing ternary alloys such as ternary perovskites that is scalable is provided. Additionally, ternary perovskites are provided that remain stable at moisture-supersaturated air, reach 22% efficiency despite being fabricated in ambient-air, and retain 80% of their initial performance for at least >2,000 hours when extrapolated from an accelerated test.

BACKGROUND

Many important technologies such as solar cells, light-emitting diodes, batteries, superconductors and thermoselectrics rely on how fast materials are discovered or developed. Because the best materials are often a blend of multiple components, high-throughput experimentations (HTEs), both for making and studying mixtures/alloys, have recently gained major attention. However, state-of-art HTEs are unfortunately able to make only a fraction of possible compositions and then employ machine learning algorithms to extrapolate to unmade compositional space.

One field which would benefit from HTE is halide perovskites, a family of semiconductors that offer an unusually long charge-carrier diffusion length for solution-processed materials. Halide perovskites hence were widely researched for a range of optoelectronics. Particularly, perovskite solar cells (PSCs) showed unprecedented rapid progress, in large part due to perovskite compositional engineering (Yoo, J. J. et al. Efficient perovskite solar cells via improved carrier management. Nat. 2021 5907847 590, 587-593, 2021; Sandström, A., Dam, H. F., Krebs, F. C. & Edman, L. Ambient fabrication of flexible and large-area organic light-emitting devices using slot-die coating. Nat. Commun. 3, 1002, 2012; Jeon, N. J. et al. Compositional engineering of perovskite materials for high-performance solar cells. Nat. 2015 5177535 517, 476-480, 2015 and Saidaminov, M. I. et al. High-quality bulk hybrid perovskite single crystals within minutes by inverse temperature crystallization. Nat. Commun. 6, 7586 2015). For instance, formamidinium plumboiodide ($FAPbI_3$) perovskite is an important photovoltaic absorber as it has an optimal bandgap of ~1.5 eV; but it unfortunately easily transforms to a different polymorph with an undesired large bandgap of 2.5 eV.

What is needed is a platform for the rapid synthesis of ternary compositions. It would be preferable if the compositions could be physically mapped. It would be still further preferable if the ternary compositions, once mapped, could be characterized in situ. It would be preferable if this method was suitable for the synthesis of ternary perovskites. It would be further preferable if superior ternary perovskites were synthesized.

SUMMARY

The present technology is a platform for the rapid synthesis of ternary compositions. The compositions can be physically mapped. The ternary compositions, once mapped, can be characterized in situ. This method is suitable for the synthesis of ternary perovskites. Superior ternary perovskites were synthesized and identified using this method.

The present technology is a method to rapidly synthesize and characterize ternary alloys. The method was used to make $Cs_xMA_yFA_zPbI_3$ perovskite alloys on a single film, on which 520 perovskite alloys were characterized using a high-throughput optical characterization tool. The stability of these perovskite alloys was tested in a high-humidity environment to find a range of ternary perovskites which remain intact under these harsh conditions. It was found that organic cations aided in stabilizing perovskite structure, while an inorganic cation (cesium) aided in the crystallization of pin-hole free films. Solar cells were fabricated using perovskites from the defined humidity-stable range and tested at elevated temperatures, unencapsulated. Three distinct degradation pathways were found in solar cells as a function of composition: (1) mixed-halide mixed-cation perovskite solar cells degrade by losing photocurrent and photovoltage; (2) single-halide organic-rich perovskite solar cells lose either photocurrent or photovoltage; and (3) single-halide inorganic-rich perovskite solar cells show the longest operational stability.

In one embodiment, a method of synthesizing and characterizing a multiplicity of ternary compositions is provided, the method comprising: selecting three components; depositing a gradient of a first component along a first axis; depositing a gradient of a second component along a second axis which is normal to the first axis, such that the gradient is thickest at a first end and thinnest at a second end; and depositing a gradient of a third component along the second axis such that the gradient is thickest at the second end and thinnest at the first end to provide a compositional distribution of the multiplicity of ternary compositions; mapping the compositional distribution of each of the multiplicity of ternary compositions; and analyzing each of the multiplicity of ternary compositions, thereby synthesizing and characterizing the multiplicity of ternary compositions.

The method may further comprise alloying the three components.

In the method, the multiplicity of ternary compositions may be perovskites.

In the method, the perovskites may be $Cs_xMA_yFA_zPbI_3$ perovskites.

In the method, the analyzing may be in situ analyzing.

In the method, mapping may be effected by one or more of nuclear magnetic resonance, powder X-ray diffraction and energy dispersive X-rays.

In another embodiment, a ternary perovskite is provided comprising $Cs_xMA_yFA_zPbI_3$, wherein y is between 0.09 and 0.25, z is between 0.89 and 0.75 and x is non-zero and is no greater than 0.1.

In another embodiment, a ternary perovskite is provided $Cs_xMA_yFA_zPbI_3$, wherein x is between 0.001 and 0.1, y is between 0.006 and 0.125 and z is between 0.9 and 0.95.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 1*a*, Schematic of perovskite cubic unit cell with $ABX_3$ composition; FIG. 1*b*, 1D superlattice of $ABX_3$ with triple A-cations showcasing accumulated offset ($\Delta=|a_2-a_1|$); FIG. 1*c*, Computed effective Goldschmidt tolerance factor for triple cation perovskites for $0.88<t_{eff}<1$.

FIG. 2*a*, Schematic of sequential deposition of three layers by slot-die coating, and robotized high-throughput screening by an optical spectrometer. FIG. 2*b*, Three steps of synthesizing ternary compositionally graded films (t-CGFs); the first layer is made by tilting the slot-die head with one pump profile to form a gradient of $CsPbI_3$ across the width of the substrate; the second and third layers are deposited by the straight slot-die head with two pump profiles to deposit gradient films of Methylammonium Lead Iodide ($MAPbI_3$) and formamidinium lead iodide ($FAPbI_3$), respectively, across the length of the substrate; coating of subsequent layers dissolve previous one(s) and recrystallize into new perovskite compositions. FIG. 2*c*, Absorption spectra after each step of fabrication. FIG. 2*d*. Variation of normalized absorbance as a function of wavelength across the film for three sequential layers. FIG. 2*e*, Normalized absorbance to global maximum showcasing gradient thickness; the gray color of the surface shows standard deviation across the film.

FIG. 3*a*. One-pump profile: Filling the reservoir of the head with $CsPbI_3$ while the speed of the head is zero, and supplying the head with the same ink and a proper speed of pumping while the head is moving. FIG. 3*b*. The setup for achieving gradient in width: A tilted head setup supplied from one pump. FIG. 3*c*. Two-pump profile: Filling the reservoir of the head with a perovskite ink while the speed of the head is zero and supplying the head with a proper solvent and a calculated speed. FIG. 3*d*. The setup for achieving gradient thickness in length: A straight head setup supplied from two pumps to dilute the filled ink by solvent while the head is moving along the substrate.

FIG. 4*a*.

$$x = a\left(\frac{Y_j}{\sigma}\right)$$

values in $Cs_xMA_yFA_zPbI_3$ for the maximum contribution range of Cs equal to 0.2 possessing a small area map. FIG. 4*b*

$$y = b\left(\frac{|1-X_i|}{\sigma}\right)$$

values in $Cs_xMA_yFA_zPbI_3$ for the maximum contribution range of MA equal to 0.5 possessing a moderate area map with a fast-decaying rate from left to right. FIG. 4*c*.

$$z = c\left(\frac{X_i}{\sigma}\right)$$

values in $Cs_xMA_yFA_zPbI_3$ for the contribution range of FA equal to 1 possessing a large area map with a slow decaying rate.

Figure 5:
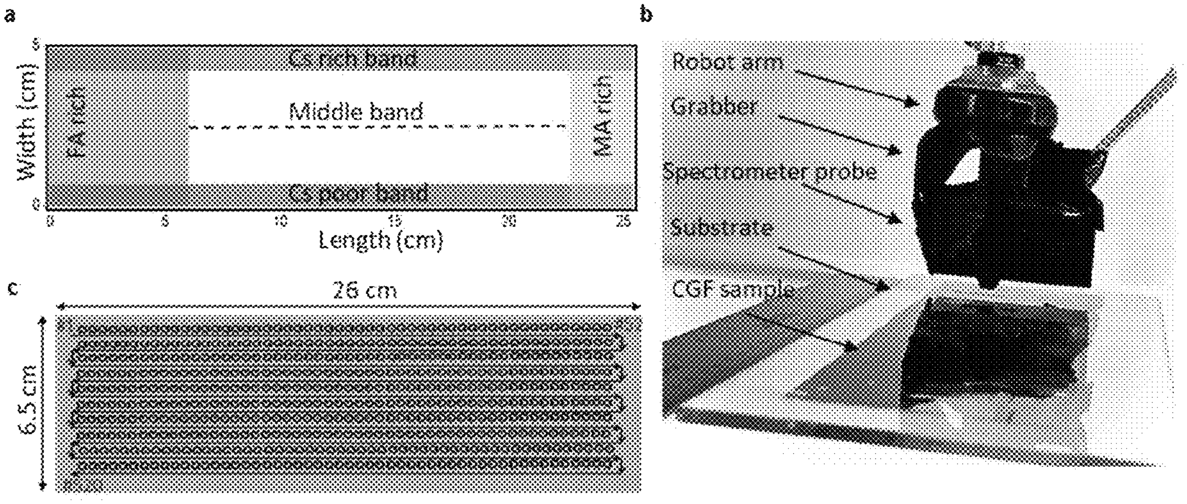

FIG. 5 is a photograph of high-throughput screening of the ternary t-CGF. FIG. 5*a*. High-throughput map of two opposite CGFs through the length with $FAPbI_3$, $MAPbI_3$, and one t-CGF across the width from the top; FIG. 5*b*. Details of robotized measurement via robot arm grabbing the probe of the spectrometer and positioning on top of the t-CGF sample; FIG. 5*c*. High-throughput measurement path for screening the ternary t-CGF via robot arm.

Figure 6:
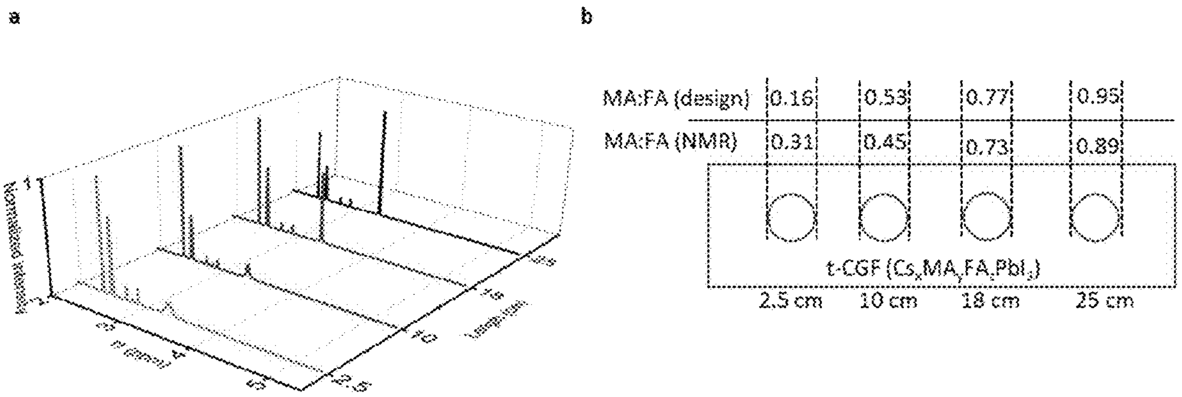

FIG. 6 is a photograph of validating organic compound ratios along the t-CGF via nuclear magnetic resonance (NMR). FIG. 6*a*. Normalized raw NMR data; FIG. 6*b*. the comparison of designed/experiment ratios of MA over FA through the t-CGF in four spots.

Figure 7:
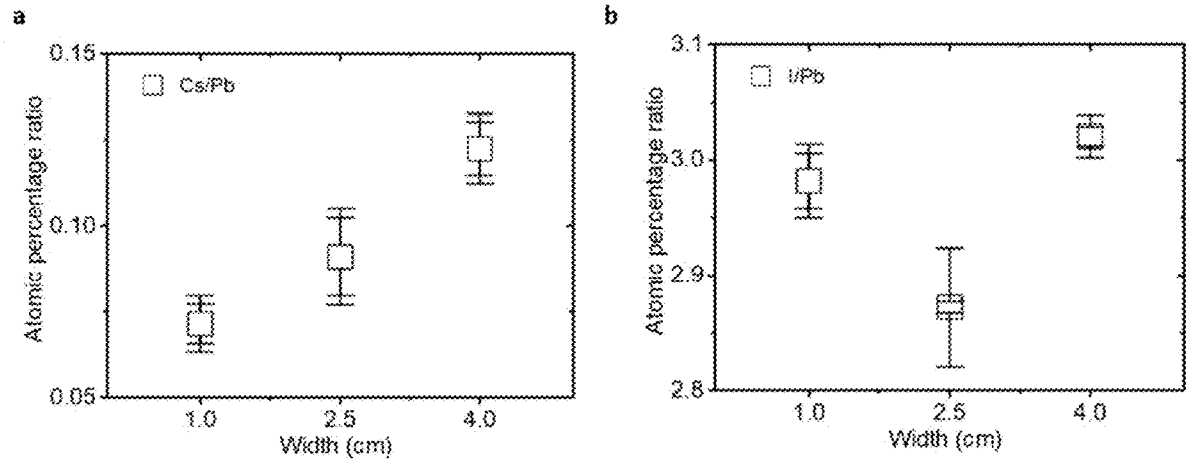

FIG. 7 is a graph quantifying gradient deposition by measuring content of atoms across the width of the t-CGF via Energy Dispersive X-Rays (EDX). FIG. 7*a*. Cesium (Cs) over lead (Pb). FIG. 7*b*. Iodine (I) over lead (Pb).

Figure 8:
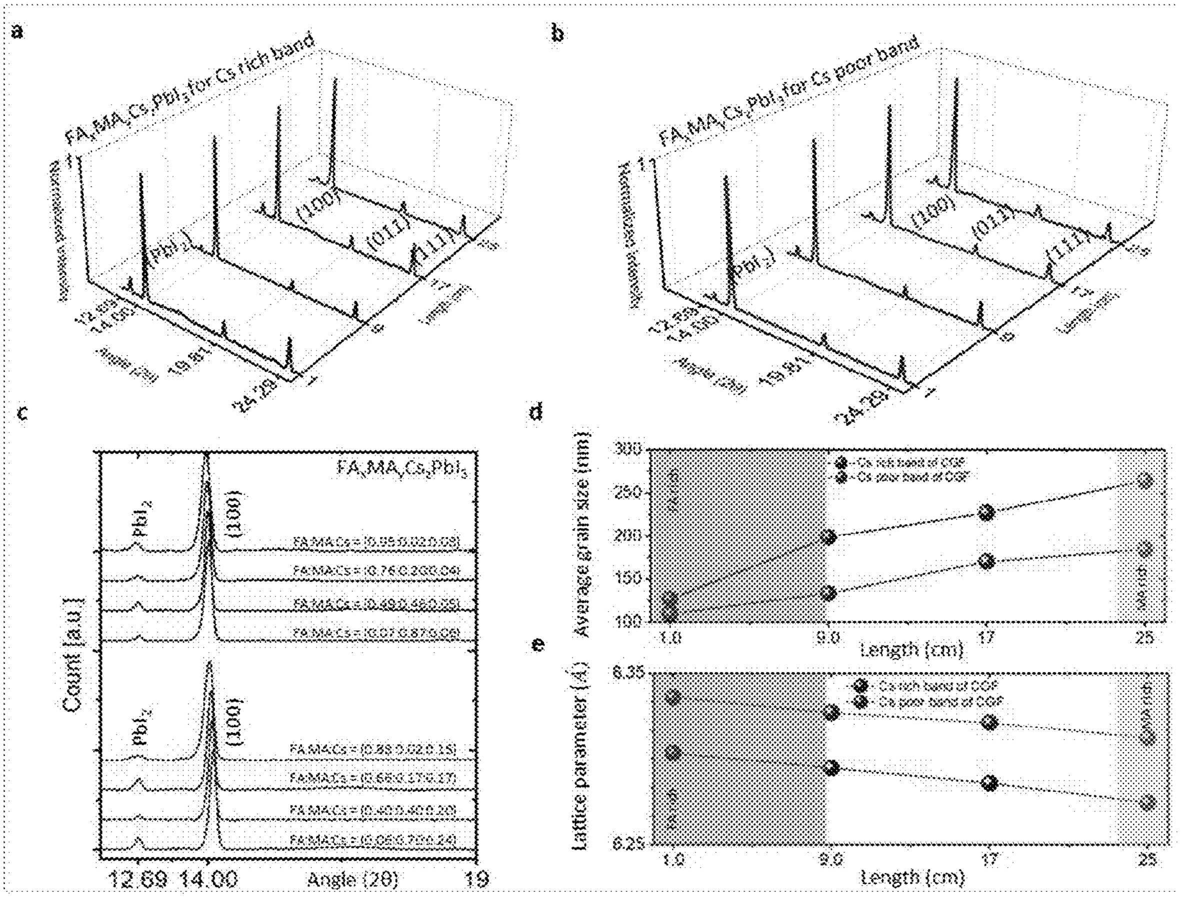

FIG. 8 is a photograph characterizing Cs-rich and Cs-poor bands via Powder X-ray diffraction (pXRD). FIG. 8*a*. Four positions from the Cs rich band of the fabricated t-CGF, FIG. 8*b*. Four positions from the Cs poor band of the fabricated t-CGF, FIG. 8*c*. Zoomed-in peaks for only (100) crystal plane of perovskite and the $PbI_2$ peaks to demonstrate the transition of the perovskite peak position and full-width at half-maximum. FIG. 8*d*. Average grain size transition through the t-CGF from FA rich segment toward the MA-rich segment for two bands. FIG. 8*e*. Lattice parameter transition through the t-CGF from the FA-rich segment toward MA-rich segment for two bands.

Figure 9:
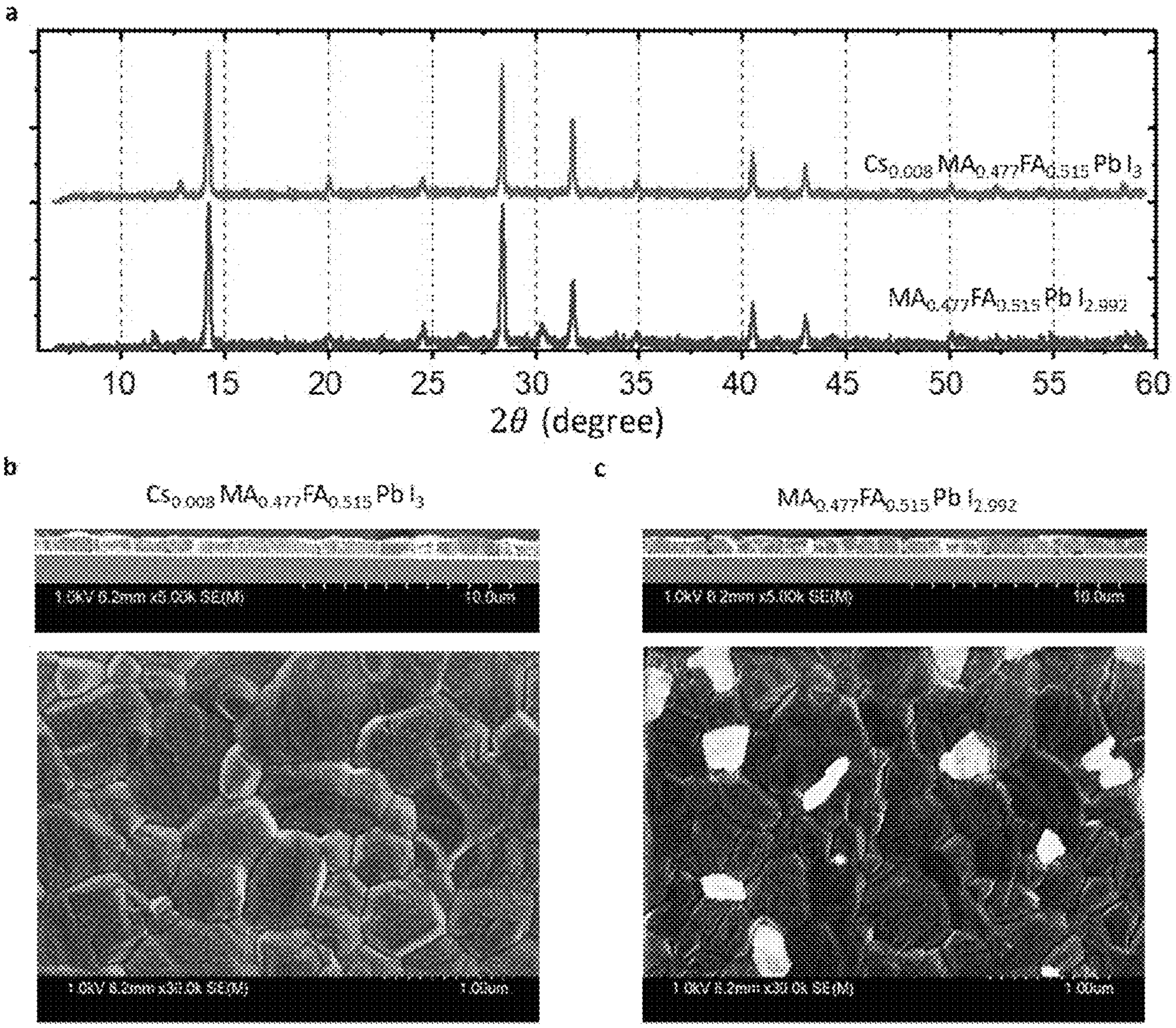

FIG. 9 is a photograph characterizing two compositions to analyze ternary cations on stabilization of perovskite. FIG. 9*a*. pXRD; FIG. 9*b*. Scanning electron microscope (SEM) results for ternary perovskite showing cross-sectional view (up) and top view (bottom) FIG. 9*c*. SEM image of binary cation perovskite showing cross-sectional view (up) and top view (bottom).

Figure 10:
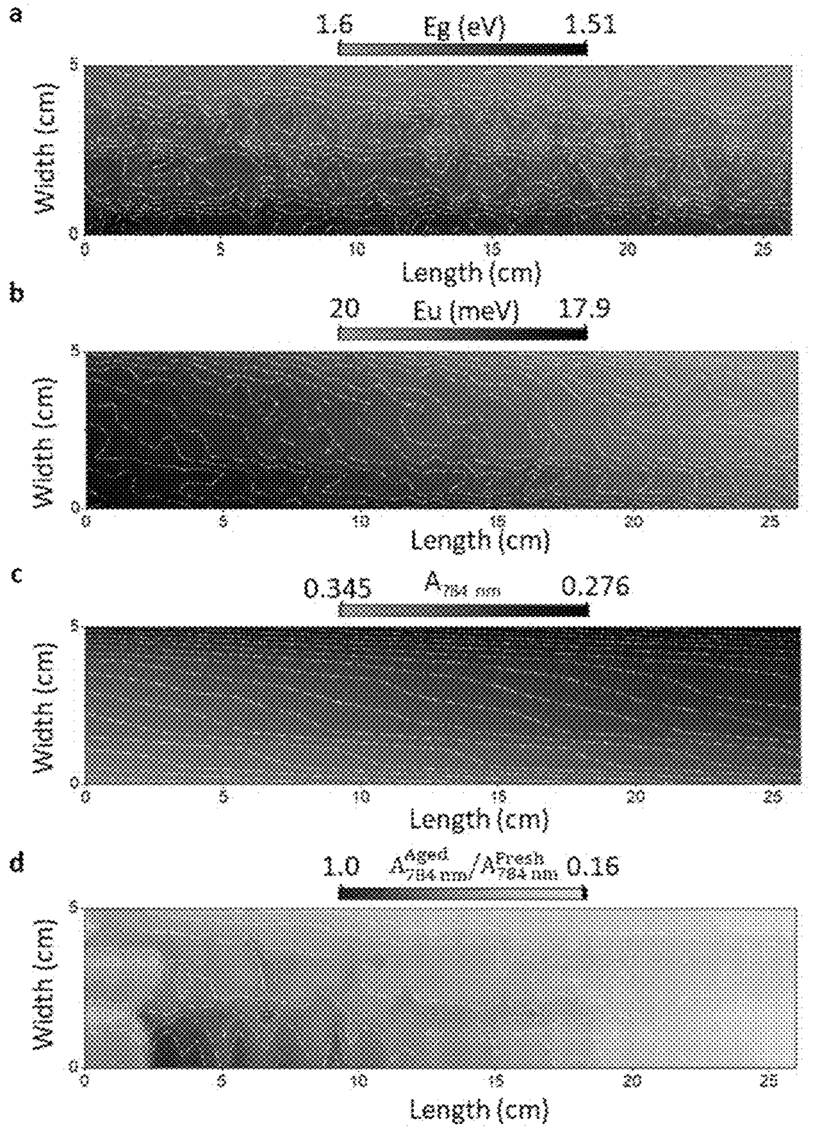

FIG. 10 is a photograph of high-throughput screening t-CGF with mapping the optoelectronic properties of 520 composition of $Cs_xMA_yFA_zPbI_3$ on real location. FIG. 10 *a*. Bandgaps, FIG. 10*b*. Urbach energies, FIG. 10*c*. Absorbance values at 784 nm, FIG. 10*d*. Ratio of absorbance values of the aged to fresh at the wavelength of 784 nm for 520 locations (compositions).

Figure 11:
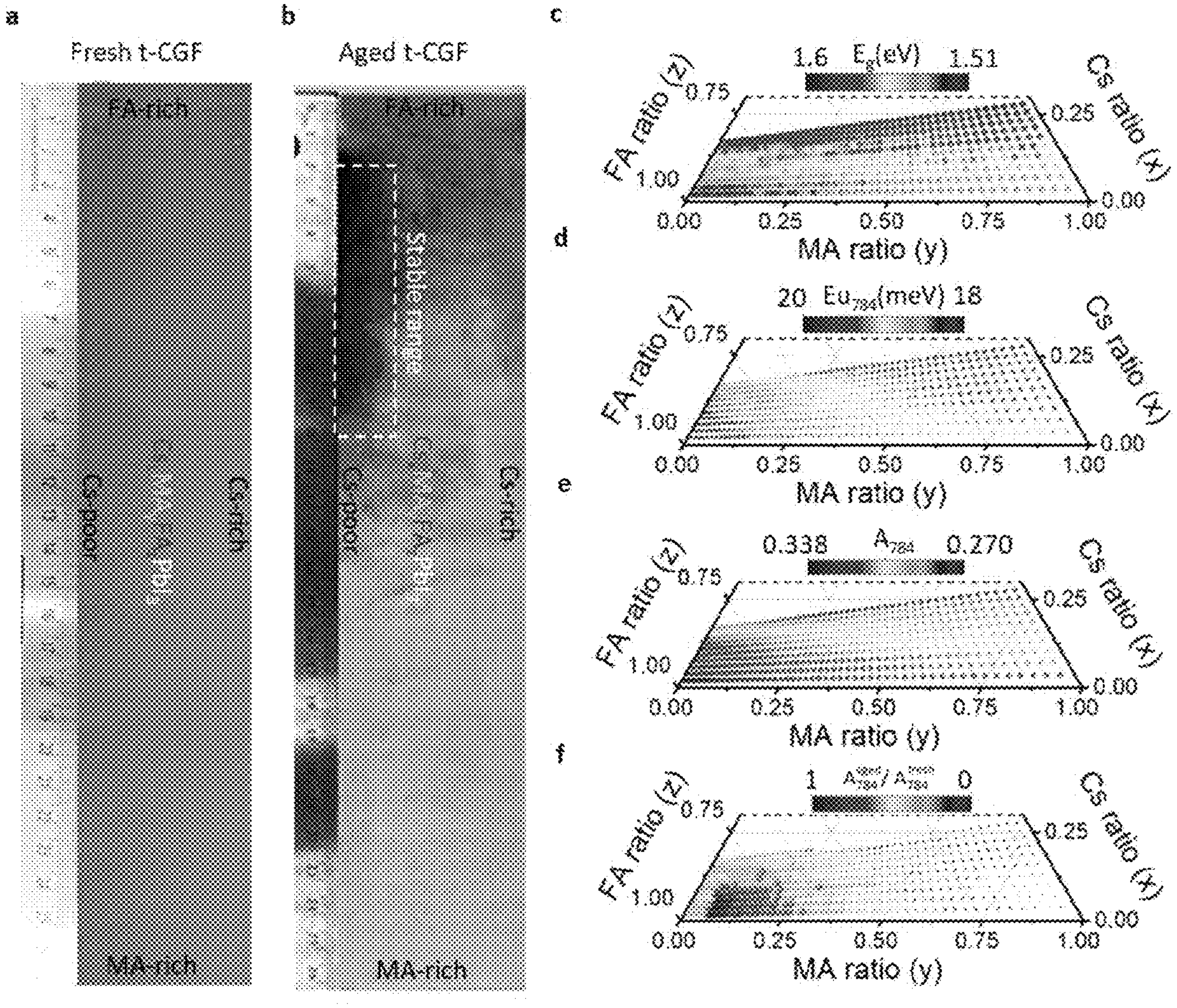

FIG. 11 is a photograph showing a stability test of $Cs_xMA_yFA_zPbI_3$ t-CGF. FIG. 11*a*, Image of fresh t-CGF of $Cs_xMA_yFA_zPbI_3$. FIG. 11*b*, Image of the same t-CGF aged for 92 days under 99% relative humidity; the dashed rectangle shows perovskite compositions that experienced no/little color change. FIG. 11*c*, Bandgaps, FIG. 11*d*, Urbach energies, FIG. 11*e*, Absorbance values, FIG. 11*f*, Ratio of absorbance values of the aged to fresh at the wavelength of 784 nm for 520 locations (compositions).

Figure 12:
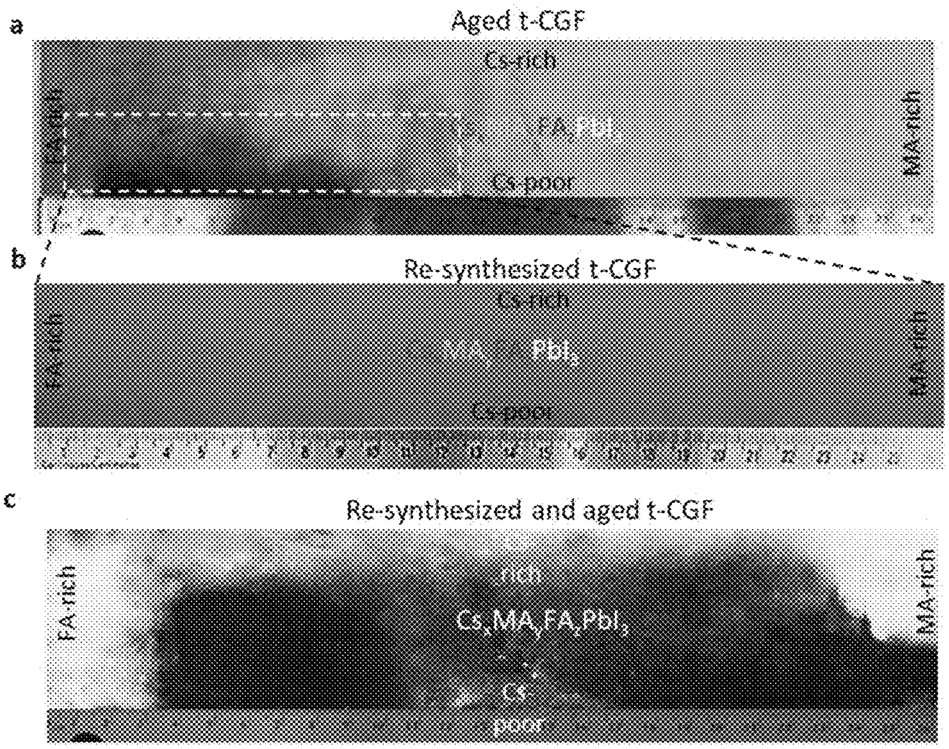

FIG. 12 is a photograph showing re-optimizing t-CGF in three steps. FIG. 12*a*. Aged t-CGF of large map are of $Cs_xMA_yFA_zPbI_3$ with stable region FIG. 12*b*. Re-synthesizing a fresh t-CGF of the previous shown map; FIG. 12*c*. Aged t-CGF under 99% relative humidity (RH) for 20 days.

Figure 13:
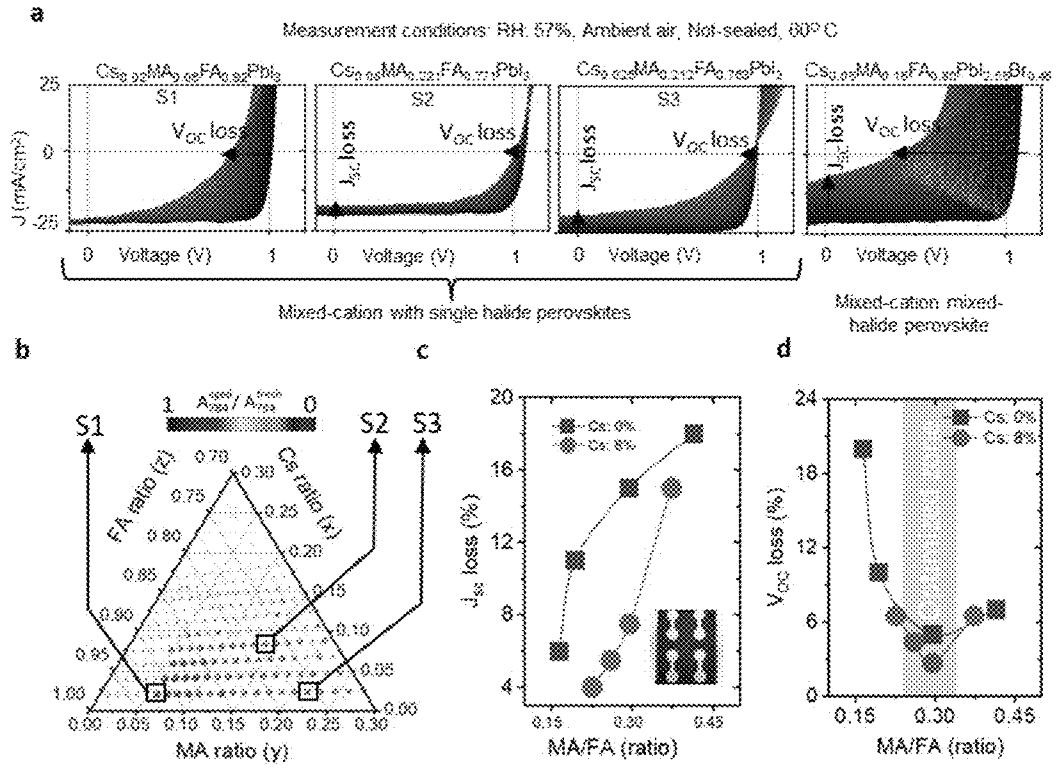

FIG. 13 is a photograph showing operational stability of ternary perovskite solar cells. FIG. 13*a*, Evolution of current-voltage characteristics of perovskite solar cells in ambient air at ~57% RH at 60° C. without encapsulation. FIG. 13*b*, Selected compositions from the stable region in the ternary diagram. FIG. 13*c*, Loss of short circuit current density ($J_{SC}$), and FIG. 13*d*, open circuit voltage ($V_{OC}$) as a function of perovskite composition within ¼ h of test in ambient air at ~57% RH at 60° C. without encapsulation.

Figure 14:
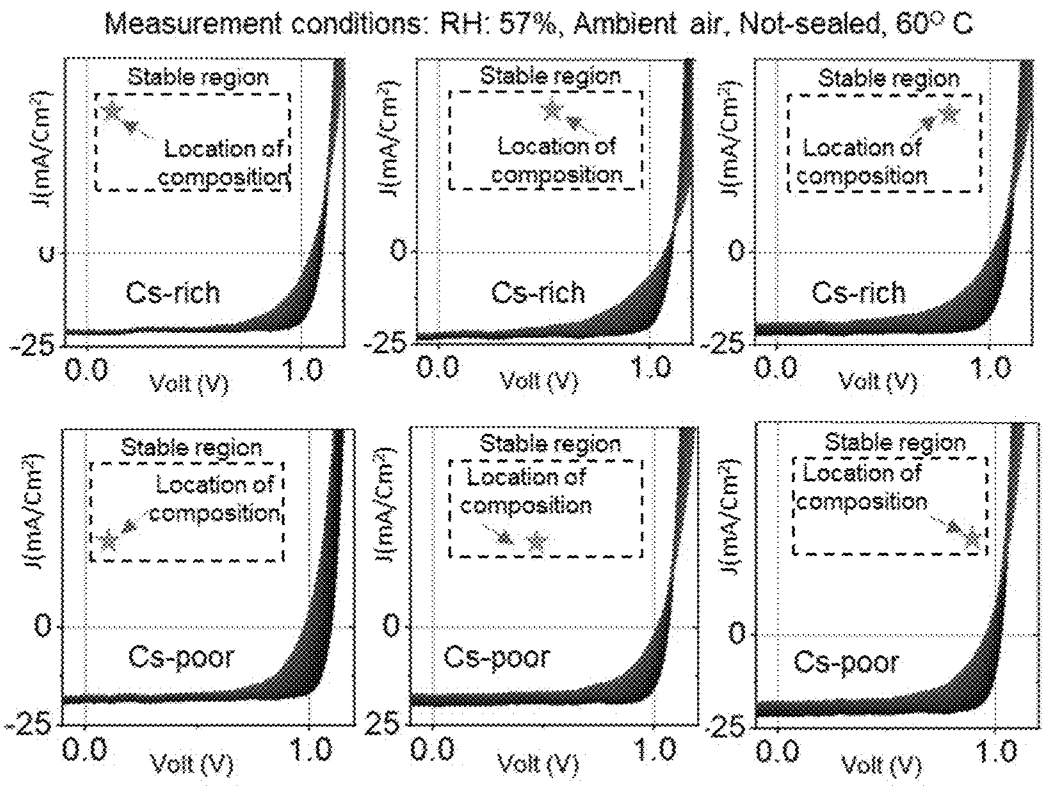

FIG. 14 is a photograph of categorizing degradation mechanism of mixed triple cation $Cs_xMA_yFA_zPbI_3$ from the discovered region by tracking the evolution of current-voltage characteristics of perovskite solar cells in ambient air at ~57% RH at 60° C. without encapsulation. The compositions of perovskite solar cells (PSCs) is divided to Cs-rich region (up), and the Cs-poor region for different MA/FA ratios (down).

Figure 15:
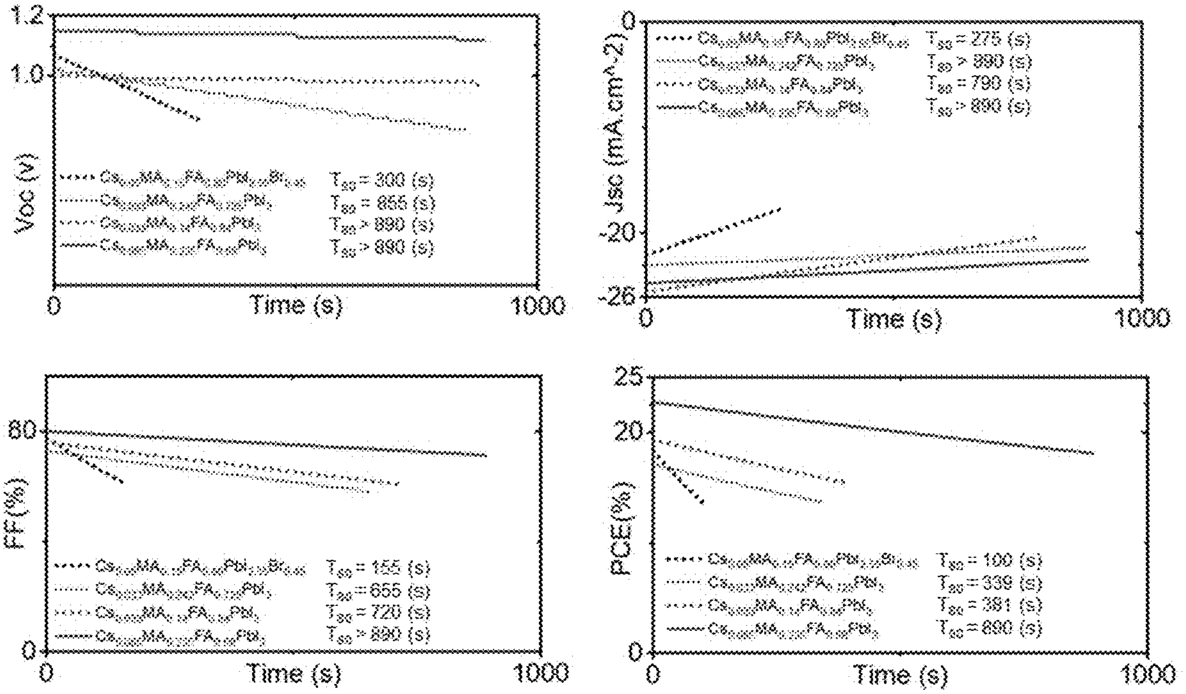

FIG. 15 is a photograph of categorizing degradation mechanism of fixed-halide from the discovered region vs. mixed-halide perovskites under high stress (e.g., elevated temperature up to 60° C., RH 57%, without sealing). The mixed-halide perovskite is reported to have at least 500 hours of stability but exhibit only 100 seconds under the given conditions; this represents a factor of $1.8*10^4$ in accelerating the degradation.

Figure 16:
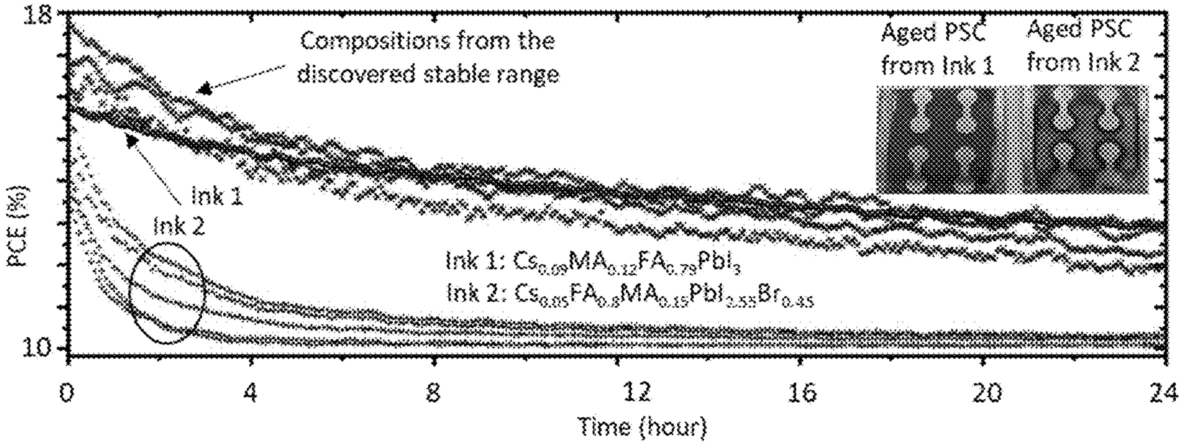

FIG. 16 is a photograph comparing the operational stability of two PSCs from the inks including the single-halide perovskites from the discovered ranges including ink 1: $Cs_{0.09}MA_{0.12}FA_{0.79}PbI_3$ vs. mixed-halide perovskites (ink 2: $Cs_{0.05}MA_{0.15}FA_{0.80}PbI_{2.55}Br_{0.45}$). The maximum power point measurement under no encapsulation and no nitrogen blowing at 45° C. for single-halide including ink 1 (black), the other compositions are from the discovered range reported in this article (red stars), and the mixed halide perovskite (ink 2 with blue stars); Inset: the appearances of two solar cell devices with the given compositions that are exposed to the ambient air after ~3 months.

DESCRIPTION

Except as otherwise expressly provided, the following rules of interpretation apply to this specification (written description and claims): (a) all words used herein shall be construed to be of such gender or number (singular or plural) as the circumstances require; (b) the singular terms "a", "an", and "the", as used in the specification and the appended claims include plural references unless the context clearly dictates otherwise; (c) the antecedent term "about" applied to a recited range or value denotes an approximation within the deviation in the range or value known or expected in the art from the measurements method; (d) the words "herein", "hereby", "hereof", "hereto", "hereinbefore", and "hereinafter", and words of similar import, refer to this specification in its entirety and not to any particular paragraph, claim or other subdivision, unless otherwise specified; (e) descriptive headings are for convenience only and shall not control or affect the meaning or construction of any part of the specification; and (f) "or" and "any" are not exclusive and "include" and "including" are not limiting. Further, the terms "comprising," "having," "including," and "containing" are to be construed as open-ended terms (i.e., meaning "including, but not limited to,") unless otherwise noted.

Recitation of ranges of values herein are merely intended to serve as a shorthand method of referring individually to each separate value falling within the range, unless otherwise indicated herein, and each separate value is incorporated into the specification as if it were individually recited herein. Where a specific range of values is provided, it is understood that each intervening value, to the tenth of the unit of the lower limit unless the context clearly dictates otherwise, between the upper and lower limit of that range and any other stated or intervening value in that stated range, is included therein. All smaller sub ranges are also included. The upper and lower limits of these smaller ranges are also included therein, subject to any specifically excluded limit in the stated range.

Unless defined otherwise, all technical and scientific terms used herein have the same meaning as commonly understood by one of ordinary skill in the relevant art. Although any methods and materials similar or equivalent to those described herein can also be used, the acceptable methods and materials are now described.

In a cubic perovskite structure of $ABX_3$ composition, the lattice parameter can be extracted from two Miller planes (FIG. 1*a*): from (200) plain in which case the unit cell ($\alpha_1$) is comprised of two radii of B and X; and from (100) plane in which case the unit cell ($\alpha_2$) is comprised of cathetus of the right-angle triangle whose hypotenuse is comprised of two radii of A and X. The ratio of $a_2/a_1$, known as Goldschmidt tolerance factor (t), should be close to unity to form a stable perovskite with no/little structural distortion.

Goldschmidt's theory was applied to assess the structural stability of iodide triple-A-cation perovskites, $Cs_xMA_yFA_zPbI_3$, where x+y+z=1. Mixed halides were not considered, as they are known, also shown below, to be prone to phase segregation. If the ternary perovskite is represented as a 1D superlattice of $N=n_1+n_2+n_3$ unit cells (FIG. 1*b*), where $n_1$, $n_2$, and $n_3$ define the ratio of A-site cations ($x=n_1/N$, $y=n_2/N$, $z=n_3/N$), then the effective tolerance factor is $t_{eff}=(n_1\alpha_2+n_2\alpha'_2+n_3\alpha''_2)/N\alpha_1$, where $\alpha_2$, $\alpha'_2$, $\alpha''_2$ are (100) lattice constants with Cs, MA and FA, respectively.

Figure 1:
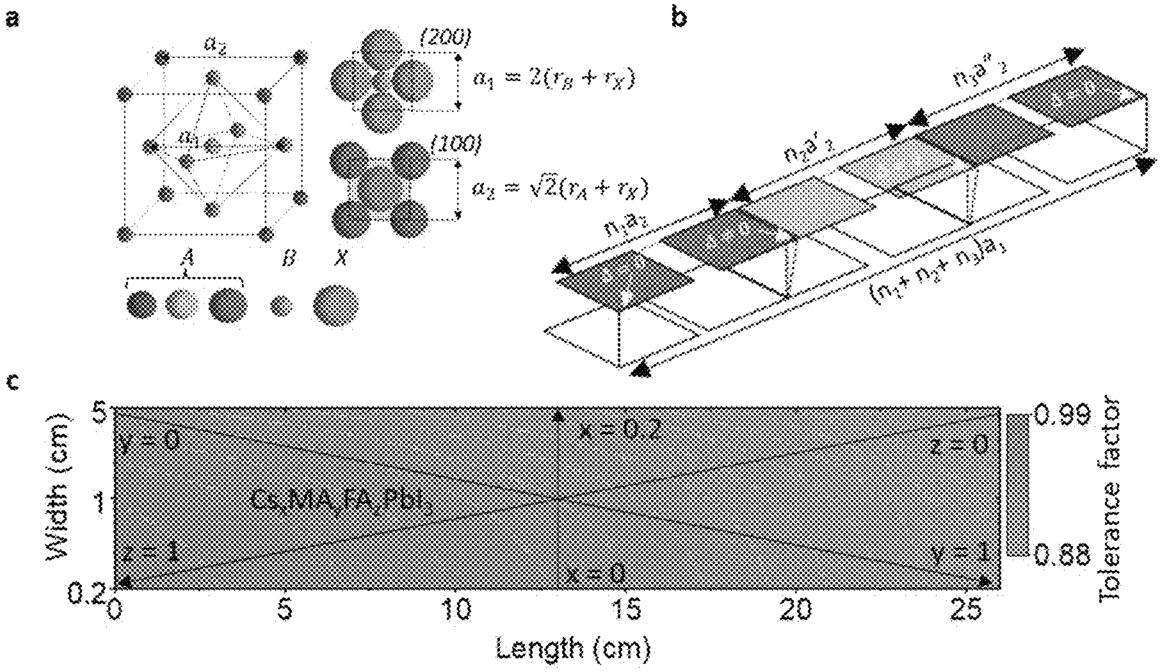
FIG. 1 is a photograph of computing effective tolerance factor of triple cation perovskites.

The effective tolerance factor for a superlattice possessing triple cations with three different lattice constants was derived: $r_A$, $r_B$, and $r_X$ are the radii of A, B, and X sites, respectively, of the $ABX_3$ composition. The lattice constant estimated in (100) and (200) planes, shown in FIG. 1*a*, are $a_1=2(r_X+r_B)$ and $a_2=\sqrt{2}(r_A+r_X)$, respectively. The tolerance factor is then $$t = a_2/a_1 \quad (1)$$

The lattice constant for the (100) plane can vary due to dissimilar ionic radii of A in triple-cation perovskite ($a_2$, $a'_2$, and $a''_2$).

Assuming a rectangular mapping area of w=5 (cm) and l=26 (cm), the positions in two dimensions (e.g., $x_i=[0; 26]$ and $y_j=[0; 5]$) to $(X_iY_i)$ were normalize as follow:

$$X_i = \left|1 - \frac{x_i}{l}\right| \text{ and } Y_j = \frac{y_j}{w}, (0 \le X_i, Y_j \le 1) \quad (2)$$

Combinatorial contribution of three cations are a, b, and c:

$$a = f(X_i, Y_j), b = g(X_i, Y_j), \text{ and } c = h(X_i, Y_j) \quad (3)$$

and the total combinatorial contribution range of triple compositions is $$\sigma = aY_j + b|1 - X_i| + cX_i; \quad (\sigma = 1) \quad (4)$$

in which a, b, and c are the maximum combinatorial contribution ranges of each cation respectively. For full ternary combinatorial composition, the maximum values of a, b, and c are 1. For a quasi-ternary composition that considers only a limited range of contribution, the a, b, and c vary based on the considered range of optimization. The first, second, and third terms in (4) are related to combinatory indices of FA, MA, and Cs, respectively. Then the optimization composition as a function of space is:

$$Cs_{a\left(\frac{Y_j}{\sigma}\right)}MA_{b\left(\frac{|1-X_i|}{\sigma}\right)}FA_{c\left(\frac{X_i}{\sigma}\right)}PbI_3 \quad (5)$$

with an effective tolerance factor of:

$$t_{eff} = \left[a\cdot\left(\frac{Y_j}{\sigma}\right)a_2 + b\cdot\left(\frac{|1-X_i|}{\sigma}\right)a_2' + c.\left(\frac{X_i}{\sigma}\right)a_2''\right] \Big/ \left[a_1\cdot\left(\frac{aY_j + b\cdot|1-X_i| + c.X_i}{\sigma}\right)\right] \quad (6)$$

Taking $t_{eff}>0.88$ as a criterion to form a stable cubic perovskite structure, the compositional range of $Cs_xMA_yFA_zPbI_3$ was 0<x<0.2, 0<y<1, and 0<z<1 (FIG. 1c).

The ternary alloys were synthesized having the defined compositional range. Making them by traditional 'fragmentary' approach would not only be time-consuming (e.g., 103 compositions only for 10% increments), but would also miss many intermediate compositions.

Figure 2:
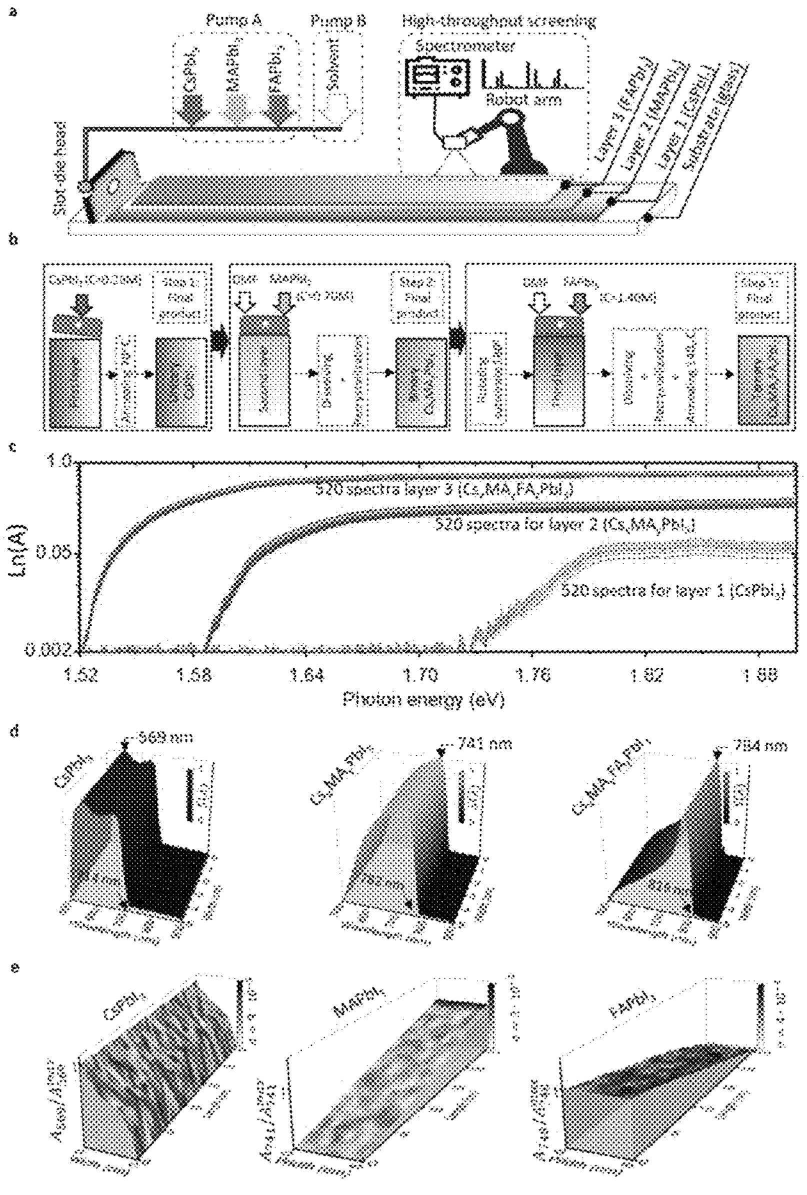
FIG. 2 is a photograph of fabrication of $Cs_xMA_yFA_zPbI_3$ t-CGF.

Ternary compositionally graded film (t-CGF) was obtained by coating gradient films of three ingredients sequentially, but with varying gradient directions (FIG. 2a). Individual graded films were synthesized by slot-die coating. The slot-die coating was facilitated by two pumps that supply the precursors and/or solvents to the reservoir of the slot-die head. A personal computer mode controller was used to program the volume and speed of injecting inks and/or solvents. The gradient program enables the pumps to provide gradient pressure on syringes and thus changing the combinatorial ratio of ink to be printed on a substrate. Since the substrate is placed on a hot plate, any deposited composition is crystallized due to quick removal of solvents. Two profiles were used for synthesizing gradient thickness in width and length of substrates.

Figure 3:
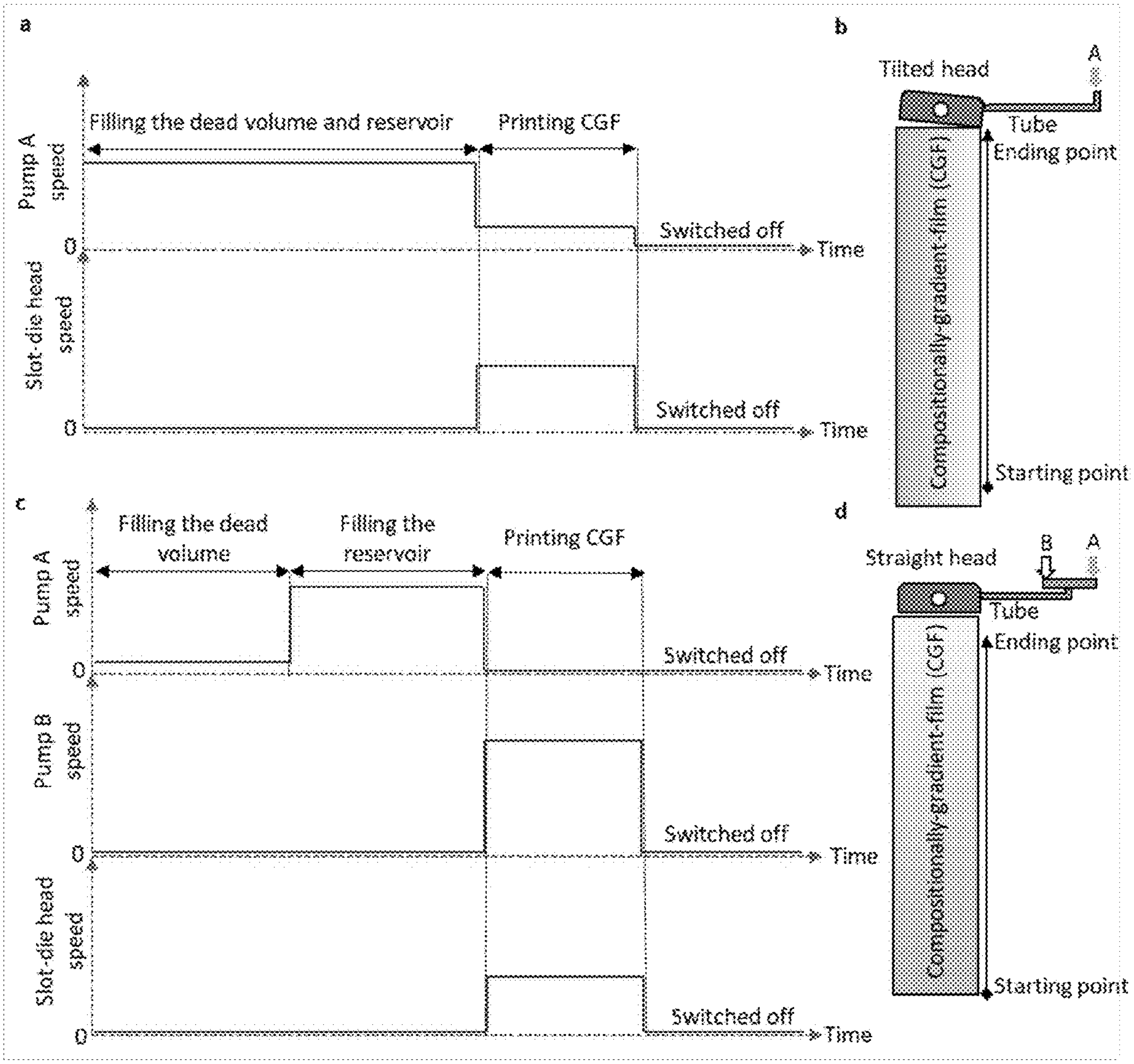
FIG. 3 is a photograph of slot-die coating profiles and the schematics of two different setups.

To achieve a gradient thin film in width for $CsPbI_3$, one pump profile of the slot-die coater (FIG. 3a) was applied and tilted the slot-die head to fabricate a gradient thickness across the width of the substrate (FIG. 3b). This leads to a gradient thickness across the substrate.

To achieve a gradient film in length for $MAPbI_3$, two pump profiles were used (FIG. 3c). The reservoir was filled of the slot-die head with $MAPbI_3$ and halted it during the deposition and instead supplied solvent from another pump to dilute the ink in situ. $FAPbI_3$ was deposited in the same way, but in opposite gradient direction.

The time needed to fill the reservoir from pump A was measured to calculate the optimized speed of pump B for considerable dilution of the stored perovskite ink. A pre-annealing temperature of 70° C. was set for the two first layers to keep the gradient map of thickness constant for the next steps and the last layer was deposited at 140° C.

Figure 4:
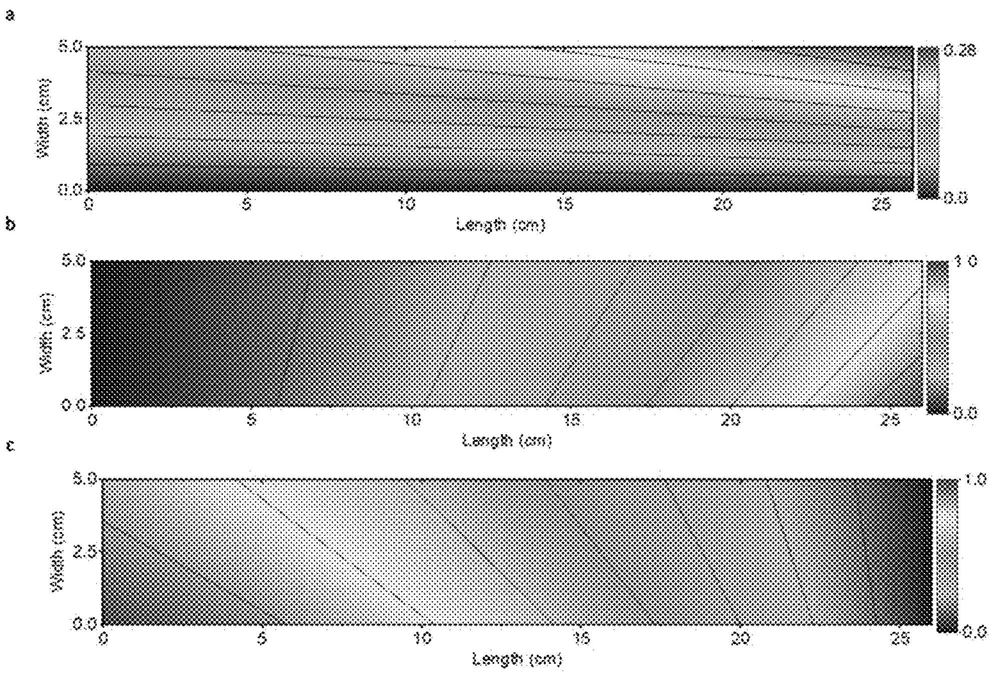
FIG. 4 is a photograph of mapping quasi-triple composition of $Cs_xMA_yFA_zPbI_3$.

To achieve t-CGFs, three layers were deposited sequentially, on top of each other, with varying thicknesses to cover the entire compositional space with asymmetric combinatorial ratios. One of the steps in preparing a t-CGF is to map the position of synthesized compositions, i.e., identifying the unknown values (e.g., x, y, and z) in the $Cs_xMA_yFA_zPbI_3$ as a function of position (X and Y) in the film. The symmetric mapping approach considers a full combinatorial range of the unknown values in a composition with a linear trend in cartesian space. For example, in a binary combinatorial system, two unknown values in $A_xB_y$ composition map x and y values in a linear manner (y=1−x) from 0 to 1 in two opposite gradient directions. On the other hand, an asymmetric mapping approach considers a quasi-combinatorial range in which the growth rates of unknown values are not equal in one space length. The asymmetric map enables the investigation of a large map area of one component to be dominant in the combinatorial contribution range. FIG. 4 shows asymmetric mapping ranges for the quasi-ternary composition of $Cs_xMA_yFA_zPbI_3$.

The t-CGF was fabricated on a substrate of 130 $cm^2$ area (5 cm width and 26 cm length). FIG. 2b provides the detailed three-step fabrication conditions of $Cs_xMA_yFA_zPbI_3$ t-CGFs. First, $CsPbI_3$ film was deposited by a tilted slot-die head to achieve a thickness gradient across the width of the substrate (FIG. 3a,b). $MAPbI_3$ was then deposited on top of $CsPbI_3$ film by an in-situ decrease of ink concentration to achieve a thickness gradient across the length of the substrate, wherein the gradient was thickest at a first end A, decreasing to a second end B (FIG. 3c,d). Finally, $FAPbI_3$ film was deposited on top of $CsPbI_3/MAPbI_3$ sandwich film, but its thickness gradient was opposite to $MAPbI_3$, such that the gradient was thickest at second end B, decreasing to first end A.

To assess the capability of the approach in the fabrication of thickness-graded films, absorption spectra were measured for every 0.25 $cm^2$ segment of the substrate, which sums up to 520 locations (130 $cm^2$/0.25 $cm^2$ i.e., 52 in length×10 in width). The measured absorption spectra were normalized and the variance of $S(\lambda)=A_{r\text{-}max}-A_{r\text{-}min}$ for 10 lines of measurement was calculated as a function of wavelength. All S(λ) were plotted for quantifying the sensitivity of spectra on the thickness of the deposited thin film. The first set of data is collected from the first layer of depositing $CsPbI_3$ which exhibits a broader range of sensitivity. The local quantification map was also plotted as shown in the second set of analyses shown in FIG. 2e for validating the quality of t-CGF layers. The maximum S(λ) was picked to normalize all Absorbance values of that specific wavelength in 10 measured lines to the maximum corresponding value. The results were mapped in height to demonstrate the linearity of the gradient deposition direction. Similarly, the Absorption values of the datasets were normalized to the average values across the width of deposition. A robotic arm and a reflection probe of a spectrometer was used to collect all spectra in 10 minutes (FIG. 5). Since absorbance directly depends on the absorber's thickness (Beer-Lambert law), absorbance value (A) was used to estimate the spatial thickness of films for each deposited layer. FIG. 2c shows the spectra for each layer at 520 locations. From the maximum variance of absorbance as a function of wavelength, S(λ), along the t-CGF photon wavelength that exhibits the highest sensitivity to the absorber's thickness were found (FIG. 2d).

The S(λ) shows a clear red-shift by adding each layer indicating successful alloying of compositions in each deposition step. The maximum S(λ) value was used to map thickness gradience along and across the fabricated t-CGF in each step (FIG. 2e). All three layers ($CsPbI_3$, $MAPbI_3$, and $FAPbI_3$) were deposited in a gradient with a low standard deviation of $\sigma<10^{-2}$ of relative absorbance (FIG. 2e) that guarantees alloying of all designed combinatorial ratios.

The exact composition of $Cs_xMA_yFA_zPbI_3$ in a specific location of t-CGF can be determined from its spatial coordinates, just like the coordinates can be calculated from the given composition, as discussed above. The compositional distribution of the $Cs_xMA_yFA_zPbI_3$ t-CGF was validated by conventional analytical methods. NMR was used to explore the ratio of organic cations (e.g., MA and FA) through the length since their gradient ratio is designed to change in length. FIG. 6*a* shows the results of NMR spectra in four positions. The varying peak at 3.32 (ppm) clarifies the variation ratio of organic compounds with different values of FA over MA. FIG. 5*b* compares the designed and measured data and shows good agreement between those. Lastly, pXRD was used to identify grain size and lattice parameters. The prepared ternary library was divided into two bands with 4 samples starting from the FA-rich region toward the MA-rich segment. Four color plots as blue, red, green, and orange were used for specifying Cs rich band, Cs poor band, FA rich region, and MA rich segment respectively. FIGS. 8*a* and 8*b* show the pXRD results for the Cs rich and Cs poor bands having $PbI_2$ peak around $2\theta=12.6$ and peaks corresponding to perovskite of Miller planes of (100), (011), and (111) at around $2\theta=14$, 19.81, and 24.29, respectively. Four samples were measured in both Cs rich and poor bands at 1 (cm), 9 (cm), 17 (cm), and 25 (cm) along the fabricated ternary t-CGF. FIG. 7*c* shows the zoomed-in peaks of $PbI_2$ and only (100) perovskite peak to demonstrate details of the peak representing a transition in peak positioning and the variation of full-width at half-maximum of the measured pXRD results. The grain size can be also affected by fabrication factors such as annealing duration. The Scherrer equation was used to compute the average grain sizes through the CGF. The analysis shows that the Cs rich band possesses a larger grain size than the Cs poor band region. Similarly, the grain size becomes bigger by reaching the MA-rich segment (FIG. 8).

The ratios of organic and inorganic ions, identified by NMR and EDX, from multiple locations, were in good agreement with the expected compositions (FIGS. 6 and 7). Powder XRD shows single peaks corresponding to the perovskite phase indicating the successful formation of alloys (FIGS. 8*a-c*), rather than multi-layered structures in which case one would expect to observe multiple perovskite diffraction peaks. Thus, each subsequent slot-die-coating dissolved the previous layers and crystallized as a new alloy:

a. $$CsPbI_{3(l)} \xrightarrow{1} CsPbI_{3(s)} \xrightarrow{2:\ MAPbI_{3(l)}} Cs_xMA_yPbI_{3(s)} \xrightarrow{3:\ FAPbI_{3(l)}} Cs_xMA_yFA_zPbI_{3(s)},$$

where I and s stand for the solution and solid, respectively.

Powder XRD spectra show shrinkage of the crystal lattice parameters from FA-rich perovskite to Cs and MA-rich perovskites, again indicating the successful formation of ternary gradient film (FIG. 8*e*). In addition, the full-width at half maxima of XRD peaks indicate that the Cs-rich films are made of larger crystallites (FIG. 8*d*); this observation is further supported by surface SEM-images of Cs-less and Cs-containing perovskite films (FIG. 9).

The t-CGFs provide an unprecedented dense library to study the properties and stability of alloys, unlike conventional approaches which study only a fragment of possible compositions. The bandgap and Urbach energy of $Cs_xMA_yFA_zPbI_3$ alloys was measured at 520 locations. The bandgap, as expected, increased from ~1.50 (eV) for FA-rich perovskite to ~1.61 (eV) for MA- and Cs-rich perovskite (FIG. 10*a*). All studied $Cs_xMA_yFA_zPbI_3$ alloys, when fresh, show a relatively small Urbach energy of 20±3 meV demonstrating low energy disorder and hence can be used to make performing cells.

FIGS. 11*a* and 11*b* show the fresh t-CGF of $Cs_xMA_yFA_zPbI_3$, and the same after it was aged at 99% relative humidity for 92 days, respectively. The humidity stress discolored a major portion of the t-CGF, while only its small area remained black (FIG. 11*b*). To quantify the stability of ternary alloys, absorbance (FIG. 11*e*) of the fresh and aged t-CGF was measured, and the ratio of absorbance values at 784 nm was determined: in this analysis, more deviation of this ratio from unity means more change, or instability, of the composition. The stable range shown in FIG. 11*b*, when decoded to composition is made of $Cs_xMA_yFA_zPbI_3$ with $0<x<0.1$; $0.1<y<0.25$; $0.75<z<0.9$ (FIG. 11*f*). FIG. 10 shows the optoelectronic properties of the t-CGF in the real space. This stable range was re-synthesized and this combinational range remained black when exposed to identical humidity stress (FIG. 12). The following provided an excellent result: $0.001<x<0.1$, $0.006<y<0.125$ and $0.9<z<0.95$. The following produced a good result: $1<x<0.125$, $0.125<y<0.25$, and $0.85<z<0.9$.

The broadest range for $Cs_xMA_yFA_zPbI_3$, was y between 0.09 and 0.25, z between 0.89 and 0.75 and x being non-zero and no greater than 0.1.

Solar cells were fabricated in a conventional architecture (Glass/ITO/$SnO_2$/Perovskite/Spiro-OMeTAD/Au) in ambient air. Three types of mono-halide perovskites from the defined stable range were chosen and entitled FA-, MA-, and Cs-rich regions (exact compositions are shown in FIG. 13 and FIG. 14). The best device showed ~22% power conversion efficiency. Mixed-halide perovskite solar cells ($Cs_{0.05}MA_{0.15}FA_{0.8}PbI_{2.55}Br_{0.45}$) were also fabricated which demonstrated over 500 hours of maximum power point operational stability at room temperature when encapsulated.

To study the stability of PSCs, their current-voltage characteristics was measured in ambient air at ~57% RH at 60° C. without encapsulation. These conditions represent accelerated tests by a factor of $\sim10^4$ compared to encapsulated devices tested with no heating stress (FIG. 15). Mixed halide perovskites demonstrate rapid degradation of all photovoltaic figures-of-merit when tested in these conditions due to phase segregation at high temperatures (FIG. 13*a*). This agrees with their rapid loss of efficiency when tested under maximum power point operation unencapsulated at 60° C. (FIG. 16). MA-rich perovskites experience rapid loss of $J_{SC}$ due to the loss of MA (FIG. 13*a*), while FA-rich perovskites experience a rapid loss of volatile organic compounds ($V_{OC}$) due to polymorphism of FA-rich perovskites (FIG. 13*a*). Cs-containing perovskites, among all, show the least loss in all photovoltaic parameters likely due to improved morphology of perovskites (FIG. 13*a*). PSCs from 8 locations of the defined stable region of ternary perovskites were fabricated (FIG. 14). FIG. 13*c*, 13*d*, and FIG. 15 show the trends as a function of composition, based on which it was concluded that $J_{SC}$ loss can be minimized with the increase of FA and Cs components, while the presence of the optimum amount of MA is needed to minimize the $V_{OC}$ loss.

In another embodiment, ternary alloys that are not ternary perovskites were synthesized using the same methodology as described herein. In yet another embodiment, ternary compositions were synthesized using three components, each in a solvent that was compatible with the solvent of the other solvents, or all components being in the same solvent.

Materials

Cesium iodide (CsI, >99.99%) were purchased from MilliporeSigma. Formamidinium iodide (FAI, >99.99%), and methylammonium iodide (MAI, >99.99%) were purchased from Great Cell, lead (II) iodide (PbI2, 99.99%) from TCI chemicals, and lead bromide (PbBr2) was purchased from Alfa Aesar as perovskite precursors. N, N-dimethyl formamide (DMF, 99.5%), dimethylsulfoxide (DMSO, 99.5%), chlorobenzene (99.5%), and acetonitrile (ACN, ≥99.9%) solvents were parched from Milipore Sigma. Tin (IV) oxide (SnO2) 15% in H2O colloidal dispersion solution was purchased from the Alfa Aesar. Sprio-OMeTAD was purchased from Xi'an Polymer Light Technology Co., Ltd. Bis(trifluoromethane) sulfonimide lithium salt (Li-TFSI 99.95%) and cobalt salt (FK 209 Co (III) TFSI) were purchased from Milipore Sigma.

Ternary CGF Fabrication

Perovskite inks were made by dissolving MAI, FAI, CsI, and $PbI_2$ in DMF and DMSO with the ratio of (4:1) to prepare 1.4 M, 0.7 M, and 0.28 M solutions of $FAPbI_3$, $MAPbI_3$, and $CsPbI_3$, respectively.

Slot-die coating was performed on InfinityPV Research Laboratory Coater (RLC). $CsPbI_3$ was deposited using one pump with a tilted head: first, the dead volume and the reservoir were filled, and then the film was deposited at a small speed. $MAPbI_3$ and $FAPbI_3$ were deposited in gradient thickness using two pumps. The dead volumes (from syringes to the end of the T junction) were filled with inks at a speed of 0.01 ml/min, and then the T junction was attached to the slot-die head. The time required to fill the slot-die head until the appearance of ink at the tip of the head at a speed of 0.3 ml/min was measured to be 56 s. Then the first ink supply was paused, but the second string containing DMF and DMSO with a 4:1 ratio was pumped at the same speed of 0.3 ml/min. The speed of the moving head along the 260 mm was installed to be 260 mm/56 s=4.64 mm/s to be able to linearly dilute the stored ink in the reservoir. $MAPbI_3$ and $FAPbI_3$ were deposited in opposite directions. The first and second layers were fabricated at 70° C.; the final layer was deposited at 140° C.

PSC Fabrication

The UV-Ozone treated glass/ITO substrates were coated with $SnO_2$ by dropping 60 µl of mixed $SnO_2$:$H_2O$ (1:6). Six ml deionized (DI) water and 1 ml of $SnO_2$ 15% in $H_2O$ colloidal dispersion nanoparticles was used and then sonicated for 30 minutes and filtered with 0.45 µm polyvinylidene difluoride (PVDF) syringe filter before deposition. The tin oxide layer is dropped and spin coated for 1 minute with 3000 r.p.m. and repeating the process twice. Then the substrate was annealed at 140° C. for 20 minutes and treated with UV-Ozone for 15 minutes. Perovskite solution based was prepared by dissolving 1 molar mass of combinatorial ratios of CsI, MAI, FAI, and $PbI_2$ on 0.666 ml of DMF: DMSO with the ratio of 1:10. Then 90 µl of mixed-cation, single-halide perovskite (1.5 M) in the ambient air was deposited by a spinner at 500 r.p.m. for 5 s, 4500 r.p.m. for the 30 s. During the last step, 500 µl of chlorobenzene was dropped on the film at the 30 s, followed by annealing at 140° C. for 10 min. Spiro solution was prepared by dissolving 0.1 mg of spiro-OMeTAD powder in 1.1 ml of chlorobenzene, 0.039 ml of tBP, 0.023 ml of Li-TFSI (dissolved in acetonitrile, 540 mg/mL), and 0.01 ml of Co-complex (dissolved in acetonitrile, 376 mg/mL) solution. Then 60 µl Spiro-OMeTAD was dynamically spin-coated for the 30 s. Finally, 70 nm gold was thermally evaporated (Angstrom Engineering). All the solutions i.e. perovskite, and spiro-OMeTAD were filtered with 0.22 µm polytetrafluoroethylene (PTEE) syringe filter.

While example embodiments have been described in connection with what is presently considered to be an example of a possible most practical and/or suitable embodiment, it is to be understood that the descriptions are not to be limited to the disclosed embodiments, but on the contrary, is intended to cover various modifications and equivalent arrangements included within the spirit and scope of the example embodiment. Those skilled in the art will recognize or be able to ascertain using no more than routine experimentation, many equivalents to the specific example embodiments specifically described herein. Such equivalents are intended to be encompassed in the scope of the claims, if appended hereto or subsequently filed.

The invention claimed is:

1. A method of synthesizing and characterizing a multiplicity of ternary compositions, the method comprising: selecting three components; depositing a gradient of a first component along a first axis; depositing a gradient of a second component along a second axis which is normal to the first axis, such that the gradient is thickest at a first end and thinnest at a second end; and depositing a gradient of a third component along the second axis such that the gradient is thickest at the second end and thinnest at the first end to provide a compositional distribution of the multiplicity of ternary compositions; mapping the compositional distribution of each of the multiplicity of ternary compositions; and analyzing each of the multiplicity of ternary compositions, thereby synthesizing and characterizing the multiplicity of ternary compositions.

2. The method of claim 1, further comprising alloying the three components.

3. The method of claim 2, wherein the multiplicity of ternary compositions are perovskites.

4. The method of claim 3, wherein the perovskites are $Cs_xMA_yFA_zPbI_3$ perovskites.

5. The method of claim 4, wherein mapping is effected by one or more of nuclear magnetic resonance, powder X-ray diffraction and energy dispersive X-rays.

6. The method of claim 5, wherein the analyzing is in situ analyzing.

7. The method of claim 1, wherein the analyzing is in situ analyzing.

8. A method of synthesizing and characterizing a multiplicity of ternary compositions, the method comprising: selecting three components; depositing a gradient of a first component along a first axis; depositing a gradient of a second component along a second axis which is normal to the first axis, such that the gradient is thickest at a first end and thinnest at a second end; and depositing a gradient of a third component along the second axis such that the gradient is thickest at the second end and thinnest at the first end to provide a compositional distribution of the multiplicity of ternary compositions; mapping the compositional distribution of each of the multiplicity of ternary compositions; and analyzing each of the multiplicity of ternary compositions, thereby synthesizing and characterizing the multiplicity of ternary compositions, wherein the ternary compositions comprise $Cs_xMA_yFA_zPbI_3$, and wherein y is between 0.09 and 0.25, z is between 0.89 and 0.75 and x is non-zero and is no greater than 0.1.

* * * * *